(12) United States Patent
Lee

(10) Patent No.: US 7,573,312 B2
(45) Date of Patent: Aug. 11, 2009

(54) APPARATUS AND METHOD OF CONTROLLING OPERATION FREQUENCY IN DLL CIRCUIT

(75) Inventor: Seong Jun Lee, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 58 days.

(21) Appl. No.: 11/826,653

(22) Filed: Jul. 17, 2007

(65) Prior Publication Data

US 2008/0136478 A1 Jun. 12, 2008

(30) Foreign Application Priority Data

Dec. 7, 2006 (KR) .................. 10-2006-0123576

(51) Int. Cl.
*H03K 3/00* (2006.01)

(52) U.S. Cl. ............... 327/294; 327/121; 327/149; 327/158; 327/291; 327/299

(58) Field of Classification Search .......... 327/113, 327/114, 116, 119, 121, 144–163, 291, 293, 327/294, 299
See application file for complete search history.

(56) References Cited

U.S. PATENT DOCUMENTS 6,356,128 B2 * 3/2002 Suga et al. .................. 327/160
6,480,045 B2 * 11/2002 Albean ....................... 327/119
6,813,197 B2 11/2004 Park
6,937,082 B2 * 8/2005 Ishimi ........................ 327/291
6,989,700 B2 1/2006 Kim
7,103,133 B2 9/2006 Jung
7,154,311 B2 12/2006 Lim
7,170,313 B2 1/2007 Shin
2001/0040472 A1 * 11/2001 Suga et al. .................. 327/156
2006/0267649 A1 11/2006 Park et al.

FOREIGN PATENT DOCUMENTS

| JP | 2005-251370 | 9/2005 |
| KR | 1020000040634 | 7/2000 |
| KR | 1020010026383 | 4/2001 |
| KR | 1020010035839 | 5/2001 |

* cited by examiner

*Primary Examiner*—Lincoln Donovan
*Assistant Examiner*—Patrick O'Neill
(74) *Attorney, Agent, or Firm*—Venable LLP; Jeffri A. Kaminski

(57) ABSTRACT

A frequency multiplier increases the frequency of an external clock and outputs a high-frequency external clock. A period determinator determines whether or not a predetermined period of the external clock elapses and outputs a period determination signal. A frequency selector selectively transmits the external clock or the high-frequency external clock to a clock input buffer under the control of a power-up signal and the period determination signal.

10 Claims, 2 Drawing Sheets

APPARATUS AND METHOD OF CONTROLLING OPERATION FREQUENCY IN DLL CIRCUIT

CROSS-REFERENCE TO RELATED PATENT APPLICATION

This application claims the benefit of Korean Patent Application No. 10-2006-0123576, filed on Dec. 7, 2006, in the Korean Intellectual Property Office, the disclosure of which is incorporated herein in its entirety by reference.

BACKGROUND OF THE INVENTION

1. Technical Field

The present invention relates to an apparatus and method of controlling an operation frequency in a DLL (Delay Locked Loop) circuit, and in particular, to an apparatus and method of controlling an operation frequency in a DLL circuit that reduces the time required for a delay locking operation.

2. Related Art

Generally, a DLL circuit is used to supply an internal clock having an earlier phase than a reference clock, which is obtained by converting an external clock, for a predetermined time. The internal clock is generated to allow a semiconductor memory apparatus having relatively high integration, such as a synchronous DRAM (SDRAM) or the like, to operate in synchronization with the external clock.

More specifically, if an external clock input through an input pin is input to a clock buffer, an internal clock is generated from the clock buffer. Subsequently, the internal clock controls a data output buffer to output data to the outside. At this time, the internal clock is delayed by the clock buffer from the external clock for a predetermined time, and output data from the data output buffer is delayed from the internal clock for a predetermined time and then output.

The output data is delayed from the external clock for a considerable amount of time and then output. Specifically, the time it takes data to be output after the external clock is applied, that is, an output data access time, becomes long.

In the related art, the phase of the internal clock is set to have a more advanced phase than the external clock for a predetermined time using the DLL circuit, such that output data can be output with no delay with respect to the external clock. That is, the DLL circuit receives the external clock and generates the internal clock having a more advanced phase than the external clock for a predetermined time. The internal clock is used as the reference clock in the data output buffer or the like.

As such, a predetermined amount of time is needed from when the DLL circuit performs the delay locking operation on the external clock until locking is completed. Generally, it is configured such that the DLL circuit completes the clock delay locking operation within 200 cycles of the loop. Accordingly, if the DLL circuit does not complete the clock delay locking operation within the 200 cycles due to PVT (Process, Voltage, and Temperature) and the like, an erroneous operation occurs. As a result, a semiconductor integrated circuit that uses the DLL circuit cannot accurately synchronize data with the clock. Further, in the semiconductor integrated circuit that includes the DLL circuit, during a test mode, tests in other areas cannot be performed until the DLL circuit completes the clock delay locking operation. Accordingly, the time required until the DLL circuit completes the delay locking operation has enormous influence on test efficiency of the semiconductor integrated circuit. In order to overcome the above-described problems, there is a need for a technology that reduces the time required for the clock delay locking of the DLL circuit. However, there is a technical limit to reducing the time required for the delay locking operation.

SUMMARY OF THE INVENTION

An exemplary embodiment provides an apparatus and method of controlling an operation frequency in a DLL circuit that prevents an erroneous operation caused by incomplete locking when the time required for a clock delay locking operation is extended due to PVT.

Another embodiment provides an apparatus and method of controlling an operation frequency in a DLL circuit that reduces the time required for a clock delay locking operation, thereby improving the test efficiency of a semiconductor integrated circuit.

Another embodiment provides an apparatus for controlling an operation frequency in a DLL circuit, the apparatus including: a frequency multiplier that increases the frequency of an external clock to output a high-frequency external clock; a period determinator that determines whether or not a predetermined period of the external clock elapses to output a period determination signal; and a frequency selector that selectively transmits the external clock or the high-frequency external clock to a clock input buffer under the control of a power-up signal and the period determination signal.

DETAILED DESCRIPTION OF EXEMPLARY EMBODIMENT

The present invention will now be described more fully with reference to the accompanying drawings, in which exemplary embodiments are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
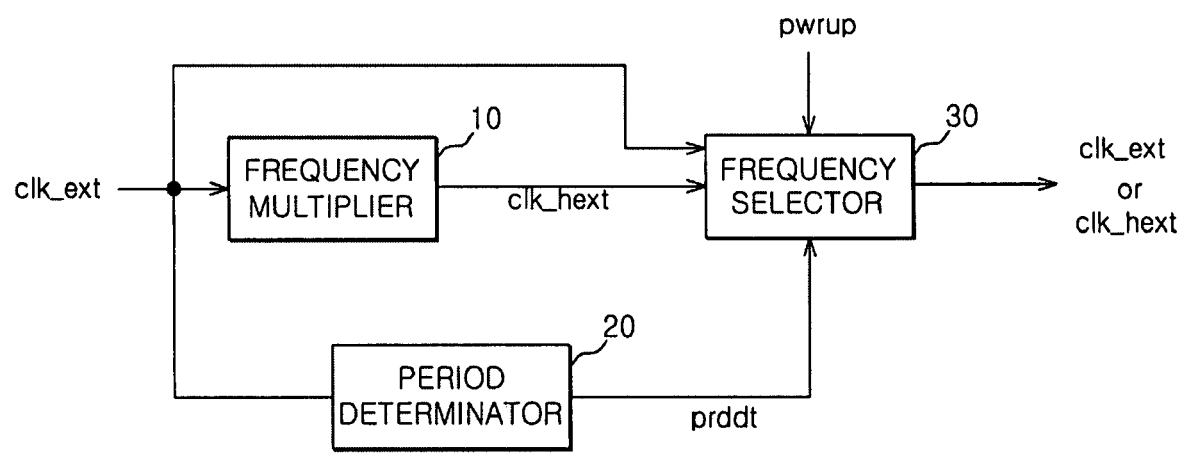
FIG. 1 is an exemplary block diagram showing the configuration of an apparatus for controlling an operation frequency in a DLL circuit.

Referring to FIG. 1, an apparatus for controlling an operation frequency (hereinafter, referred to as "operation frequency control apparatus") for a DLL circuit according to an embodiment of the invention includes a frequency multiplier 10, a period determinator 20, and a frequency selector 30.

The frequency multiplier 10 increases the frequency of an external clock clk_ext to output a high-frequency external clock clk_hext.

The period determinator 20 determines whether or not a predetermined period of the external clock clk_ext elapses to output a period determination signal prddt.

The frequency selector 30 selectively transmits the external clock clk_ext or the high-frequency external clock clk_hext to a clock input buffer under the control of a power-up signal pwrup and the period determination signal prddt.

The high-frequency external clock clk_hext output from the frequency multiplier 10 has a frequency several times higher than the frequency of the external clock clk_ext. That is, the frequency of the high-frequency external clock clk_hext may be two or three times higher than the frequency of the external clock clk_ext. Moreover, the ratio of the high-frequency external clock clk_hext generated by the frequency multiplier 10 to the external clock clk_ext is not limited thereto.

The period determinator 20 calculates a number of toggles of the external clock clk_ext so as to determine a defined cycle of the DLL circuit during which the delay locking operation is completed. The period determinator 20 may be a counter circuit. The period determinator 20 detects a predetermined number (for example, 200) of toggles of the external clock clk_ext and recognizes the cycle of the DLL circuit during which the delay locking operation is completed. Then, if the cycle of the DLL circuit during which the delay locking operation is completed ends, the period determinator 20 enables the period determination signal prddt to perform an outputting operation. The period determination signal prddt may be a low enable signal.

Next, if the power-up signal pwrup is enabled during an initial operation of the DLL circuit, the frequency selector 30 transmits the high-frequency external clock clk_hext to the clock input buffer in a state where the period determination signal prddt is disabled, and transmits the external clock clk_ext to the clock input buffer in a state where the period determination signal prddt is enabled.

That is, the operation frequency control apparatus of the DLL circuit transmits the high-frequency external clock clk_hext to the clock input buffer when the defined cycle of the DLL circuit during which the delay locking operation is completed is in progress, such that the DLL circuit performs the delay locking operation faster. If the defined cycle of the DLL circuit during which the delay locking operation is completed ends, the operation frequency control apparatus of the DLL circuit transmits the external clock clk_ext to the clock input buffer, such that the DLL circuit performs a normal operation. Subsequently, if the power-up signal pwrup is disabled, the external clock clk_ext is transmitted to the clock input buffer.

Figure 2:
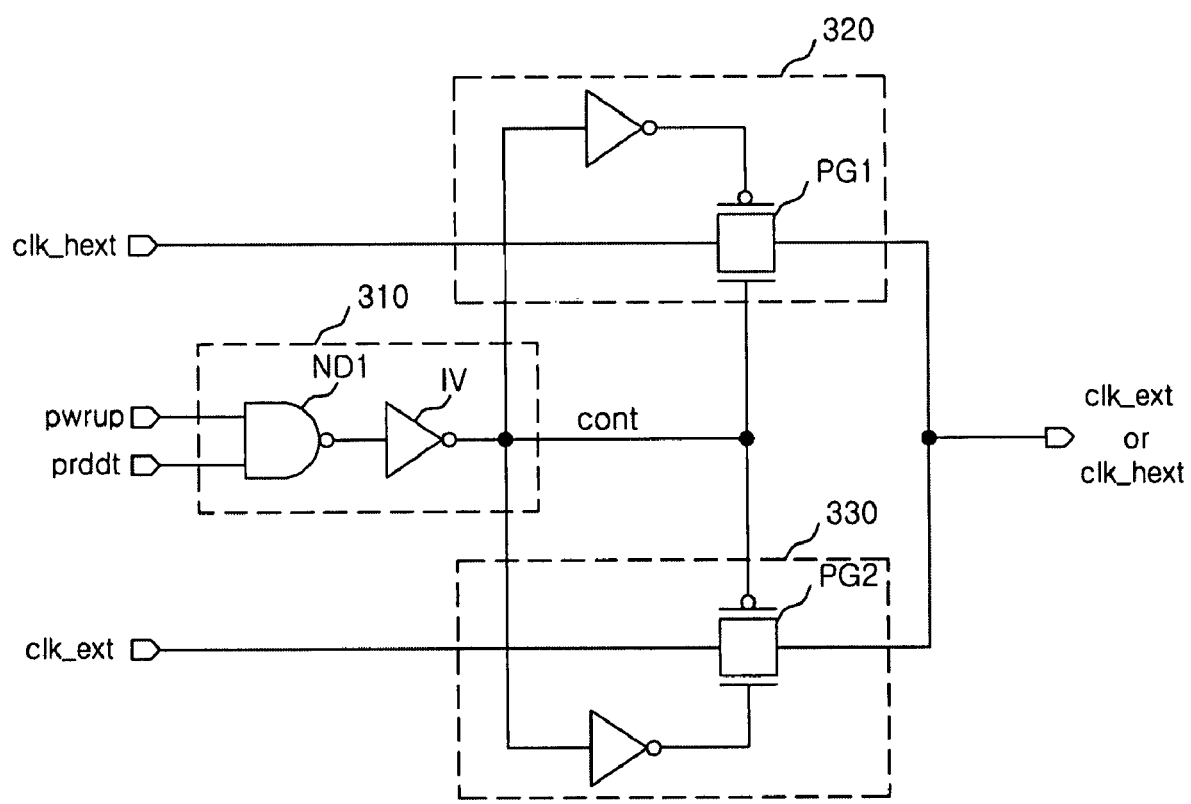
FIG. 2 is an exemplary diagram showing the detailed configuration of a frequency selector shown in FIG. 1.

FIG. 2 is a diagram showing the detailed configuration of the frequency selector 30 shown in FIG. 1.

Referring to FIG. 2, the frequency selector 30 may include a control unit 310, a first switching unit 320 and a second switching unit 330.

The control unit 310 receives the power-up signal pwrup and the period determination signal prddt, to output a control signal cont.

The first switching unit 320 transmits the high-frequency external clock clk_hext to an output terminal of the frequency selector 30 when the control signal cont is enabled.

The second switching unit 330 transmits external clock clk_ext to the output terminal of the frequency selector 30 when the control signal cont is disabled.

The control unit 310 includes a NAND gate ND that receives the power-up signal pwrup and the period determination signal prddt, and an inverter IV that inverts an output signal of the NAND gate ND and outputs the control signal cont.

The first switching unit 320 includes a first pass gate PG1 that is turned on if the control signal cont is enabled.

The second switching unit 330 includes a second pass gate PG2 that is turned on if the control signal cont is disabled.

During the initial operation of the DLL circuit, the power-up signal pwrup is enabled. The period during which the power-up signal pwrup is enabled matches with the defined cycle of the DLL circuit during which the delay locking operation is completed.

In a state where the power-up signal pwrup is enabled at a high level, and the period determination signal prddt is disabled at a high level, the control signal cont is enabled at a high level. Accordingly, the first pass gate PG1 of the first switching unit 320 is turned on, and the second pass gate PG2 of the second switching unit 330 is turned off. As a result, the high-frequency external clock clk_hext is output as an output signal of the frequency selector 30.

If the period determination signal prddt is enabled at a low level, the control signal cont is disabled. Then, the first pass gate PG1 of the first switching unit 320 is turned off, and the second pass gate PG2 of the second switching unit 330 is turned on. As a result, the external clock clk_ext is output as the output signal of the frequency selector 30.

If the initial operation of the DLL circuit ends, and the power-up signal pwrup is disabled, the control signal cont is kept disabled regardless of whether the period determination signal prddt is enabled or disabled. Accordingly, the external clock clk_ext is output as the output signal of the frequency selector 30.

That is, in the operation frequency control apparatus of the DLL circuit according to the one embodiment, during the defined loop cycle of the DLL circuit during which the delay locking operation is completed, the high-frequency external clock having a frequency several times higher than the frequency of the external clock is transmitted to the clock input buffer of the DLL circuit. As a result, the delay locking operation of the DLL circuit is performed at a higher speed.

If the defined loop cycle of the DLL circuit during which the delay locking operation is completed elapses, the external clock is transmitted to the clock input buffer of the DLL circuit, thereby supporting the normal operation of the DLL circuit. Accordingly, an erroneous operation of the DLL circuit can be prevented. Further, in a test mode of a semiconductor integrated circuit including the DLL circuit, the time required until the delay locking operation of the DLL circuit is completed is reduced, and thus the test efficiency of the semiconductor integrated circuit is improved.

It will be apparent to those skilled in the art that various modifications and changes may be made without departing from the scope and spirit of the invention. Therefore, it should be understood that the above embodiment is not limitative, but illustrative in all aspects. The scope of the invention is defined by the appended claims rather than by the description preceding them, and therefore all changes and modifications that fall within metes and bounds of the claims, or equivalents of such metes and bounds are therefore intended to be embraced by the claims.

What is claimed is:

1. An apparatus for controlling an operation frequency in a DLL circuit, the apparatus comprising:
    a frequency multiplier adapted to receive and increase a frequency of an external clock to output a high-frequency external clock;
    a period determinator adapted to receive the external clock, determine when a predetermined period of the external clock elapses and output a period determination signal; and
    a frequency selector adapted to receive the external clock, the high-frequency external clock which is the output signal of the frequency multiplier, a power-up signal and the period determination signal and selectively transmit the external clock or the high-frequency external clock to a clock input buffer according to control of the power-up signal and the period determination signal.

2. The apparatus of claim 1,
    wherein the frequency multiplier is adapted to generate the high-frequency external clock having a frequency several times higher than the frequency of the external clock.

3. The apparatus of claim 1,
wherein the period determinator is adapted to calculate a number of inputs of the external clock and determine a defined cycle of the DLL circuit during which a delay locking operation is completed, and generate the period determination signal.

4. The apparatus of claim 1,
wherein the frequency selector is adapted to transmit the high-frequency external clock to the clock input buffer when the period determination signal is disabled, and transmit the external clock to the clock input buffer when the period determination signal is enabled, when the power-up signal is enabled.

5. The apparatus of claim 1,
wherein the frequency selector comprises
a control unit adapted to receive the power-up signal and the period determination signal and output a control signal,
a first switching unit adapted to receive the control signal and transmit the high-frequency external clock to an output terminal of the frequency selector when the control signal is enabled; and
a second switching unit adapted to receive the control signal and transmit the external clock to the output terminal of the frequency selector when the control signal is disabled.

6. A method of controlling an operation frequency in a DLL circuit, the method comprising:
increasing a frequency of an external clock thereby outputting a high-frequency external clock;
determining a cycle of the DLL circuit when a delay locking operation of the DLL circuit is completed using a number of toggles of the external clock and thereby outputting a period determination signal; and
selectively transmitting the external clock or the high-frequency external clock to a clock input buffer dependant on whether the period determination signal is enabled or disabled.

7. The method of claim 6,
wherein the increasing of the frequency of the external clock comprises generating the high-frequency external clock having a frequency several times higher than the frequency of the external clock.

8. The method of claim 6,
wherein selectively transmitting the external clock or the high-frequency external clock to the clock input buffer comprises transmitting the high-frequency external clock to the clock input buffer when the period determination signal is disabled and transmitting the external clock to the clock input buffer if the period determination signal is enabled, when a power-up signal is enabled.

9. The method of claim 8,
wherein selectively transmitting the external clock or the high-frequency external clock to the clock input buffer comprises:
receiving the power-up signal and the period determination signal and outputting a control signal;
outputting the high-frequency external clock if the control signal is enabled; and
outputting the external clock if the control signal is disabled.

10. An apparatus for controlling an operation frequency in a DLL circuit, the apparatus comprising:
a frequency multiplier configured to increase a frequency of an external clock for several times and output a high-frequency external clock;
a period determinator configured to receive the external clock, determine whether a delay locking operation of the DLL circuit is completed using a number of toggles of the external clock, and output a period determination signal; and
a frequency selector configured to receive the external clock and the high-frequency external clock and selectively transmit the external clock or the high-frequency external clock to a clock input buffer in response to a power-up signal and the period determination signal,
wherein the frequency selector is configured to output the high-frequency external clock when the DLL circuit is in the delay locking operation, and output the external clock when the delay locking operation of the DLL circuit is completed.

* * * * *